United States Patent [19]

Gleason et al.

[11] Patent Number: 5,006,793
[45] Date of Patent: Apr. 9, 1991

[54] HIGH-FREQUENCY ACTIVE PROBE HAVING REPLACEABLE CONTACT NEEDLES

[75] Inventors: K. Reed Gleason, Portland; Keith E. Jones, Aloha, both of Oreg.

[73] Assignee: Cascade Microtech, Inc., Beaverton, Oreg.

[21] Appl. No.: 364,091

[22] Filed: Jun. 8, 1989

[51] Int. Cl.$^5$ .................. G01R 1/06; G01R 31/02
[52] U.S. Cl. .................... 324/158 P; 324/158 F
[58] Field of Search ............. 324/158 P, 158 F, 72.5

[56] References Cited
U.S. PATENT DOCUMENTS 4,161,692  7/1979  Tarzwell ................. 324/158 P
4,739,259  4/1988  Hadwin et al. .

OTHER PUBLICATIONS

Skobern, J. R.; "Subminiature . . . "; IBM Tech. Dis Bull.; vol. 19; No. 10; Mar. 1977; p. 3678.

Primary Examiner—Ernest F. Karlsen
Attorney, Agent, or Firm—Chernoff, Vilhauer, McClung & Stenzel

[57] ABSTRACT

A high-frequency probe comprising a semirigid coaxial line which terminates in an active circuit assembly. The coaxial line's outer conductor is connected to a box while its inner conductor is connected to an active circuit chip. A signal contact needle is attached to the active circuit chip and extends linearly with the coaxial line. The signal needle is held in place with a mass of epoxy filled with silica microballoons, providing a low-capacitance mount.

A ground contact needle is connected to a wiper which contacts the box, thus providing a direct, and short, path between the coaxial line's outer conductor and the ground contact needle.

4 Claims, 3 Drawing Sheets

HIGH-FREQUENCY ACTIVE PROBE HAVING REPLACEABLE CONTACT NEEDLES

BACKGROUND OF THE INVENTION

The present invention relates to a probe for use in measuring circuit parameters. More specifically, the invention concerns a high-frequency probe having active circuitry positioned near its signal contact needle.

Ideally, a measurement probe would not affect a measured circuit's performance, yet it would accurately provide the circuit's state to a measurement instrument. To achieve this, an ideal high-frequency probe would present an infinite input resistance and zero input capacitance to the circuit being measured. Although an actual probe will have a non-infinite input resistance and a non-zero input capacitance, its input characteristics may be improved using active circuitry positioned near its contact needles.

Typically, active probes use cantilevered contact pins for making electrical connection with a measured circuit. Such cantilevered pins have significant capacitance and dictate relatively long return ground paths. Furthermore, such cantilevered pins can hinder precise pin placement since an increase in the contact pressure can cause the pin to flex and thus displace laterally.

Telescoping pin probes overcome the repeatable positioning problems of cantilevered probes. One such probe is shown in Hadwin et al., U.S. Pat. No. 4,739,259. However, the probe of Hadwin has no active circuitry near its contact tip, nor does it provide a relatively short return ground path.

What is needed, then is a high-frequency probe which has a relatively high input resistance and minimal input capacitance and which provides a relatively short return ground path.

SUMMARY OF THE INVENTION

The present invention provides apparatus and means for providing a high-frequency active probe, thus overcoming the above-mentioned shortcomings and drawbacks of the previously available active probes.

In accordance with the present invention, a semirigid coaxial line terminates in an active circuit assembly. The coaxial line's outer conductor is connected to a box while its inner conductor is connected to an active circuit chip which is mounted in and grounded to the box. A signal contact needle is attached to the active circuit chip and extends linearly with the coaxial line. A sleeve surrounds a portion of the coaxial line directly adjacent the active circuit assembly. The outer diameter of the sleeve fits within a mounting block which controls the sleeve's movement and facilitates repeatable placement of the signal contact needle. Also, the active circuit assembly can be withdrawn into the mounting block to provide protection from static or mechanical damage.

A positionably-mounted ground contact needle is connected to a wiper which contacts the box, thus providing a direct, and short, path between the coaxial line's outer conductor and the ground contact needle.

It is therefore a principal object of the present invention to provide a high frequency probe having active circuitry near the signal contact needle.

It is another object of the present invention to provide for precise and repeatable placement of the contact needles.

It is another object of the present invention to provide for a short ground path.

It is another object of the present invention to provide a sturdy, yet low-capacitance, support for the probe signal contact needle.

It is another object of the present invention to provide a replaceable signal contact needle.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
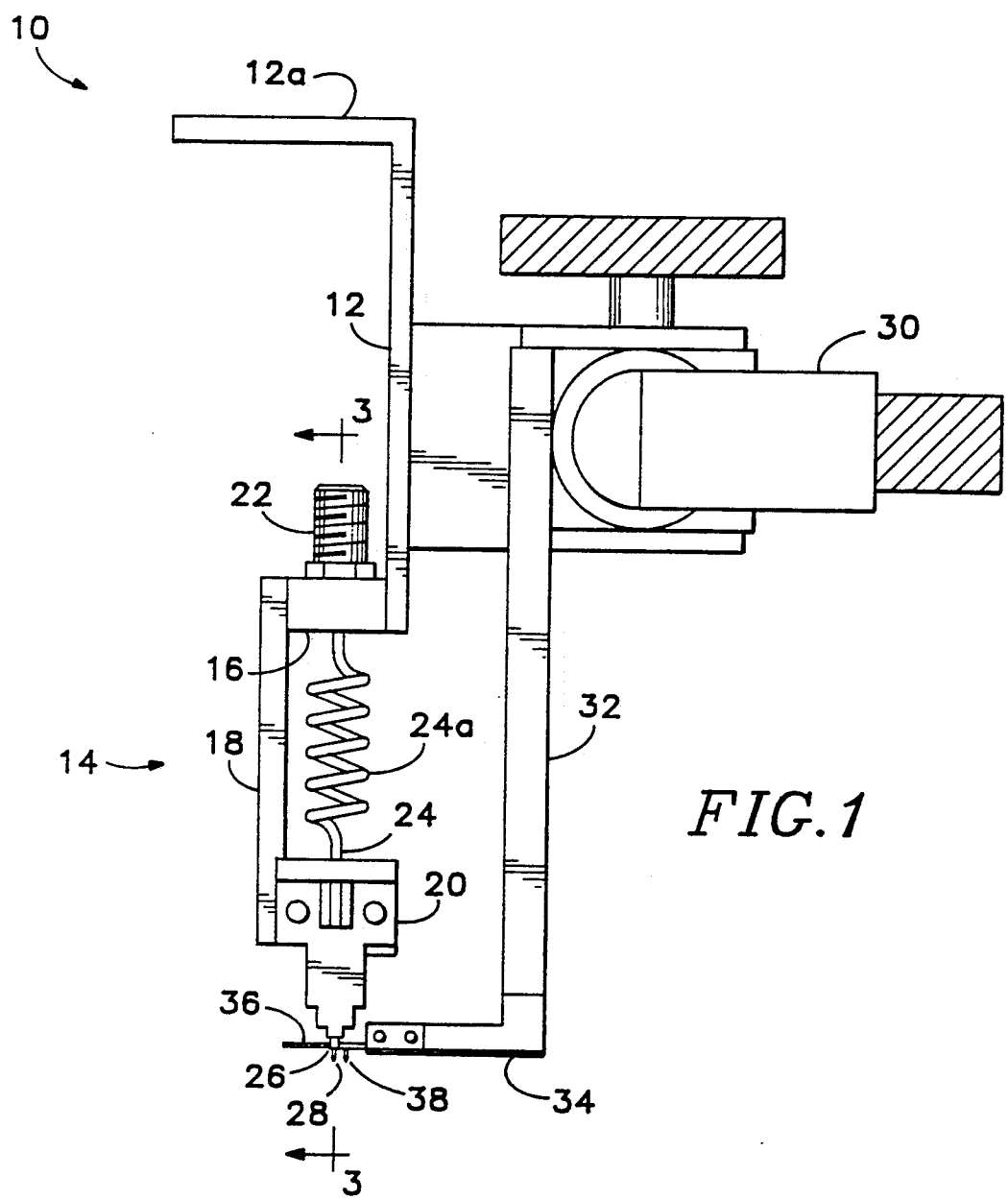
FIG. 1 is an elevation view of an exemplary probe assembly according to the present invention.

Referring to the drawings, where like reference numerals refer to like elements on the different drawings, and with particular reference to FIG. 1, an exemplary probe assembly 10 is shown. The probe assembly includes a frame 12 having an upper portion 12a which is adapted to attach to a probe mount. The probe mount preferably can translate the frame in three dimensions and can rotate it about a vertical axis. Attached to the lower portion of the mounting frame 12 is an integral probe head 14 comprising a mounting block 16, a connector bar 18, and a guiding block 20. A coaxial connector 22 is attached to the top of the mounting block. A semirigid coaxial transmission line 24 which is electrically connected to the coaxial connector 22, is formed with loops 24a to provide resiliency, and passes through a cylindrical passageway 40 (FIG. 3) in the guiding block, and is connected at its lower end to an active circuit assembly 26. A signal contact needle 28 extends from the lower portion of the active circuit assembly. The lower portion of the probe head 14 will be discussed in more detail below.

An XYZ positioner 30 is attached to the mounting frame 12. Extending below the positioner is a leg 32 ending in a horizontal foot 34. Preferably, the bottom of the foot is coated with plastic, allowing the foot to make incidental contact with a circuit being tested without damaging the circuit. A wiper 36 attached to the end of the foot makes electrical contact with the active circuit assembly 26. A ground contact needle 38 which is electrically connected to the wiper, and thus is also connected to the active circuit assembly, extends below the bottom surface end of the foot. The wiper facilitates a short inductive path between the active circuit assembly 26 and the ground contact needle.

The XYZ positioner 30 can move the foot 34 horizontally in a direction parallel to the length of the wiper 36 for controlling the horizontal distance between the signal and ground contact needles. The positioner can move the foot vertically for adjusting the relative vertical positions of the tips of the ground and signal contact needles. In addition, the positioner can move the foot horizontally in a direction perpendicular to the length of the wiper for controlling the contact force between the wiper and active circuit assembly 26.

Figure 2:
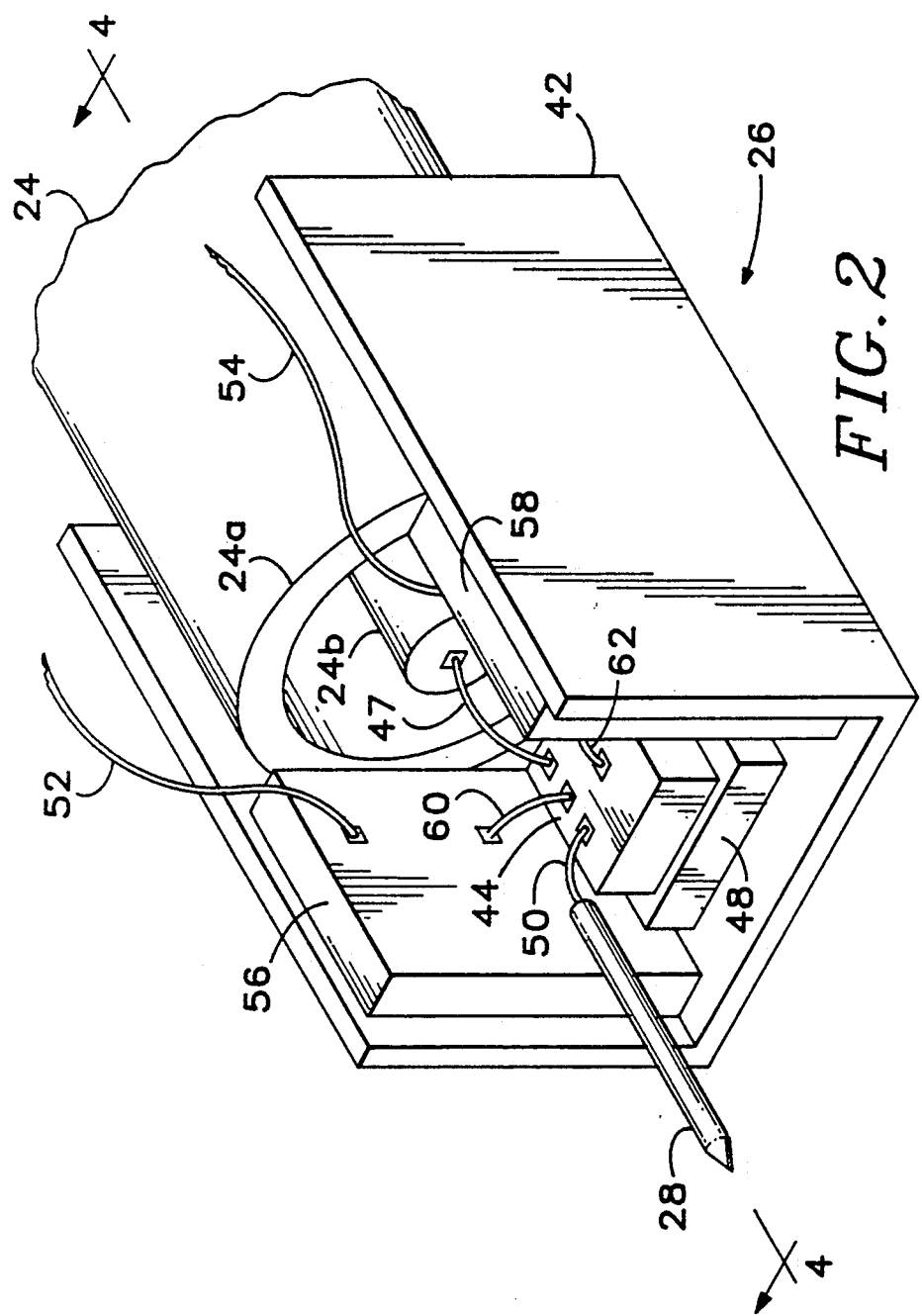
FIG. 2 is a perspective view of an active circuit assembly portion of the probe assembly with the mass of epoxy and microballoons omitted for clarity.
Figure 3:
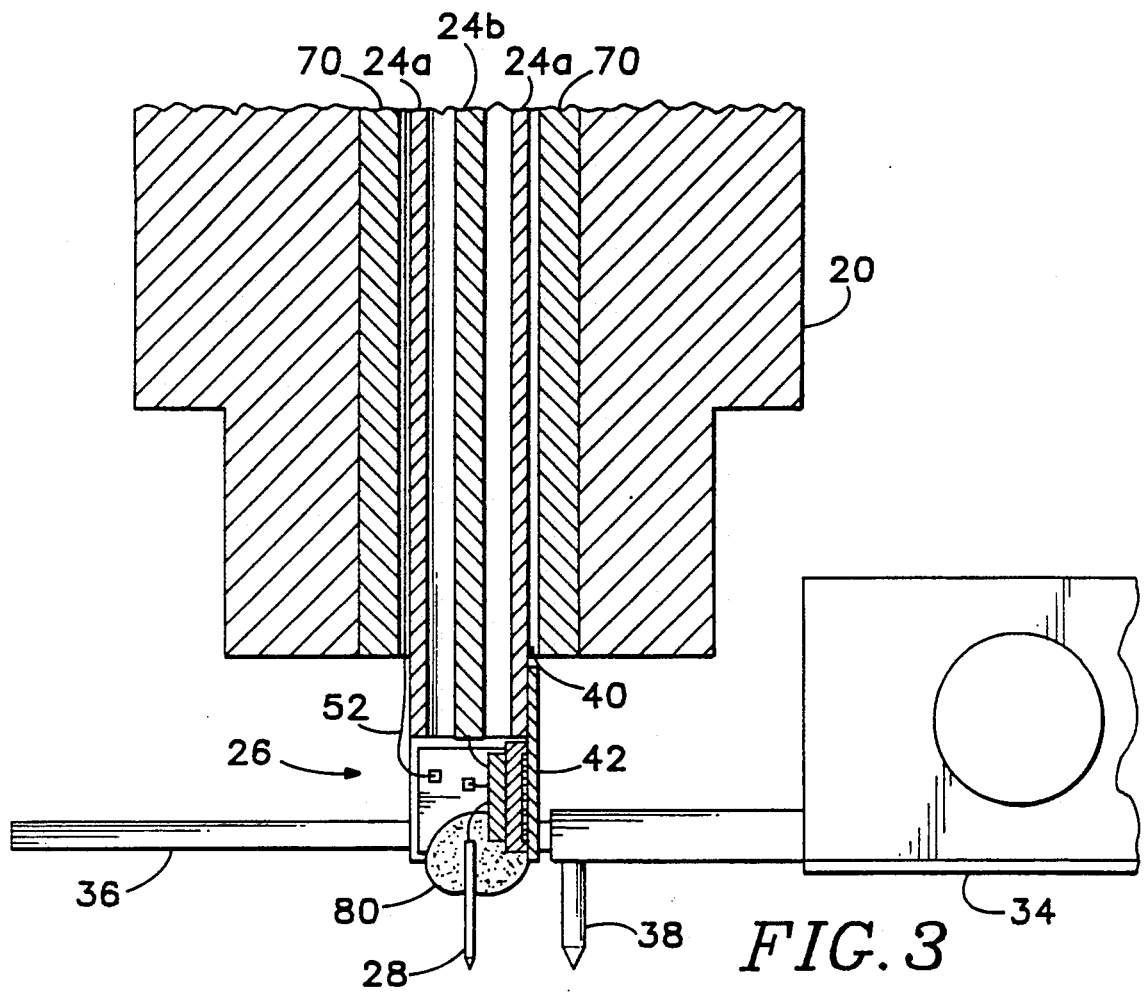
FIG. 3 is a cross-sectional view of the probe assembly along lines 3—3 of FIG. 1.
Figure 4:
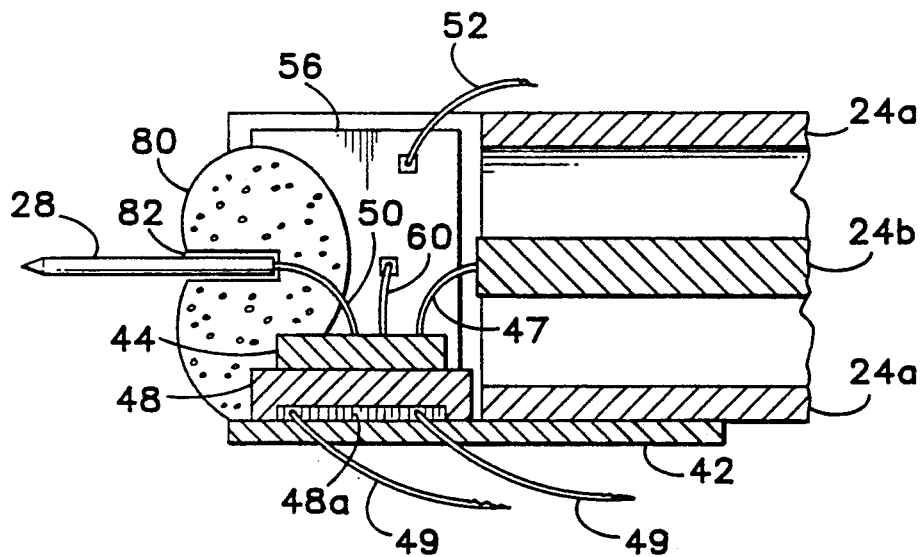
FIG. 4 is a cross-sectional view of the active circuit assembly along lines 4-4 of FIG. 2.

Referring now to FIG. 2, the active circuit assembly 26 is shown in more detail. A mass of epoxy filled with silica microballoons is omitted from FIG. 2 for clarity. The mass 80 is shown in FIGS. 3 and 4. A conductive box 42 is attached to the outer conductor 24a of the semirigid coaxial line 24 and contains the active circuitry. The wiper 36 (FIGS. 1 and 3) makes physical contact with the outer surface of the box, providing an electrical path from the outer conductor 24a to the ground contact needle 38. An active circuit chip 44 is connected via a bondwire 47 to the coaxial line's inner conductor 24b and is supported by a chip resistor 48. The signal contact needle 28 is also connected via a bondwire 50 to the active circuit chip 44. A DC power supply line 52 is connected to a first terminal of a bypass capacitor 56. A bondwire 60 connects the first terminal of the bypass capacitor 56 to the active circuit chip 44. The capacitor's other terminal is connected to the box 42. Likewise, a second DC power supply line 54 is connected to another bypass capacitor 58, which is connected to the active circuit chip 44 via bondwire 62.

Referring now to FIG. 3, the lower portion of the probe head 14 is shown in more detail. The guiding block 20 has a cylindrical sleeve 70 having a cylindrical passageway 40 through which the semirigid coaxial line 24 passes. The sleeve's inner diameter is slightly greater than the outer diameter of the semirigid coaxial transmission line, leaving room for DC power supply lines 52, 54 and resistor supply lines 49 to pass between the sleeve 70 and the transmission line. The active circuit assembly 26 is attached to the bottom end of the coaxial line 24. The cylindrical sleeve 70 is interposed between the mounting block 18 and coaxial line 24, encasing the coaxial line. The sleeve is attached to the coaxial line and its outer diameter is greater than the largest lateral dimension of the active circuit assembly 26, allowing the sleeve and active circuit assembly 26 to be withdrawn into the guiding block 20, protecting the active circuit assembly and signal contact needle.

Referring now to FIG. 4, the active circuit assembly 20 is shown in cross section. The box 42 is attached to the outer conductor 24a of the semirigid coaxial transmission line 24. The inner conductor 24b is attached to the active circuit chip 44, which is supported by a chip resistor 48. The resistive portion 48a of the chip resistor can be provided with power by resistor supply lines 49 and is positioned away from the active circuit chip 44 to minimize its capacitive effect. One of the bypass capacitors 56 is shown, with the attached power signal line 52 and bondwire 60 to the active chip. A mass 80 of epoxy filled with silica microballoons is positioned adjacent to the circuit chip. A channel 82 having a slightly larger diameter than the signal contact needle 28 extends partially through the mass. The bondwire 50 provides an electrical connection from the active chip to the interior end of the channel 82. The signal needle 28 is held in place and electrically connected to the bondwire 50 with a solder having a relatively low melting temperature, such as indium-tin solder.

Because the epoxy and microballoon mass 80 is largely air, it has a relatively low dielectric constant, minimizing the capacitance of the needle mount. Further, because of the needle's small size and orientation, it is relatively fragile and cannot flex to absorb shock. Thus, the signal needle is rigidly mounted to the active circuit assembly which is rigidly attached to the semirigid coaxial transmission line. The semirigid line is allowed to move vertically within the guide block, with the coils 24a (FIG. 1) providing resiliency to protect the signal needle. When transporting the probe head 14 (FIG. 1) separately from the frame 12, the active circuit assembly 26 can be withdrawn into the guide block 20, protecting the signal needle and active circuit chip from damage.

The signal contact needle 28 is replaceable without requiring additional equipment or special skills. Using the probe mount, the needle is moved down into contact with an adhesive material such a removable adhesive tape. Power is provided to the chip resistor 48 through resistor supply line 49, heating the entire active circuit assembly 26. When the assembly has heated sufficiently to melt the solder, the probe mount is used to raise the probe assembly, leaving the signal contact needle behind. The probe assembly is then positioned over a new signal contact needle which is embedded in a similar adhesive material, and lowered so that the needle is inserted into the channel 82. The power to the chip resistor is then turned off and the solder allowed to cool and solidify before raising the probe assembly.

To ensure that a proper amount of solder remains in the channel 82, the new signal contact needle may be pre-tinned with solder. In this case, the solder would be allowed to melt before removing the power from the chip resistor 48. Alternatively, pins having the diameter of the signal contact needle 28 may be provided with excess solder or solder wicking surfaces to add or remove solder from the channel 82 before inserting a new signal needle. The probe mount would be used to position the pins in the channel in the same manner as described for a new signal contact needle.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. A circuit probe for providing two electrical connections to a circuit under test, comprising:
    (a) an elongate transmission line having a first conductor and a second conductor, said transmission line having a longitudinal axis;
    (b) first contact needle means connected to said first conductor of said transmission line for contacting a first selected location on said circuit under test;
    (c) a conductive surface connected to said second conductor of said transmission line;
    (d) wiper means for conductively contacting said conductive surface at a variable contact position, said wiper means and said conductive surface being movable with respect to each other so as to vary said contact position;
    (e) second contact needle means, attached to said wiper means and spaced from said first contact needle means, for contacting a second selected location on said circuit under test; and
    (f) selectively actuatable positioning means remote from said wiper means and from said conductive surface for varying said contact position so as to adjust the relationship between said first contact needle means and said second needle means, and linkage means remotely operatively interconnecting said positioning means with at least one of said wiper means and said conductive surface for causing relatively movement therebetween in response to actuation of said positioning means.

2. The circuit probe of claim 1 wherein said first contact needle means and said second contact needle means, respectively, are spaced from each other along a direction substantially perpendicular to said longitudinal axis of said transmission line, and said positioning means includes means for causing relative movement between said wiper means and said conductive surface along a direction substantially perpendicular to said longitudinal axis of said transmission line so as to adjust the spacing between said first contact needle means and said second contact needles means along said direction.

3. The circuit probe of claim 1 wherein said first contact needle means and said second contact needle means are elongate and extend generally in the same longitudinal direction in side-by-side, spaced relationship, and wherein said positioning means includes means for causing relative movement between said wiper means and said conductive surface along a direction substantially parallel to said longitudinal direction so as to adjust the relative positions of said first and second contact needle means along said longitudinal direction.

4. The circuit probe of claim 3 wherein said longitudinal direction is substantially parallel to said longitudinal axis of said transmission line.

* * * * *

UNITED STATES PATENT AND TRADEMARK OFFICE
CERTIFICATE OF CORRECTION

PATENT NO. : 5,006,793

DATED : April 9, 1991

INVENTOR(S) : K. Reed Gleason et al.

It is certified that error appears in the above-identified patent and that said Letters Patent is hereby corrected as shown below:

Col. 5, line 3  change "relatively" to --relative--

Signed and Sealed this

Fifteenth Day of September, 1992

Attest:

DOUGLAS B. COMER

Attesting Officer                Acting Commissioner of Patents and Trademarks